(12) United States Patent
Masuda et al.

(10) Patent No.: US 12,432,860 B2
(45) Date of Patent: Sep. 30, 2025

(54) ELECTRONIC DEVICE

(71) Applicant: TDK CORPORATION, Tokyo (JP)

(72) Inventors: Akihiro Masuda, Tokyo (JP); Katsuya Miura, Tokyo (JP); Natsuki Kumagai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 188 days.

(21) Appl. No.: 18/522,664

(22) Filed: Nov. 29, 2023

(65) Prior Publication Data

US 2024/0196538 A1   Jun. 13, 2024

(30) Foreign Application Priority Data

Dec. 13, 2022   (JP) ................. 2022-198936

(51) Int. Cl.
  *H05K 1/02*   (2006.01)
  *H05K 1/18*   (2006.01)
(52) U.S. Cl.
  CPC .......... *H05K 1/183* (2013.01); *H05K 1/0203* (2013.01); *H05K 2201/09372* (2013.01); *H05K 2201/10015* (2013.01); *H05K 2201/10022* (2013.01); *H05K 2201/1003* (2013.01)

(58) Field of Classification Search
  CPC .............. H05K 1/0203; H05K 1/0209; H05K 2201/10272
  See application file for complete search history.

(56) References Cited

U.S. PATENT DOCUMENTS

2016/0351481 A1* 12/2016 Kawakita .......... H01L 23/49582
2018/0122537 A1*  5/2018 Sentoku ................. H01C 7/008
2019/0140155 A1*  5/2019 Kums ..................... F21V 29/74

FOREIGN PATENT DOCUMENTS

JP     H11-8158 A     1/1999
JP     2022-79393 A   5/2022

* cited by examiner

*Primary Examiner* — Sherman Ng
(74) *Attorney, Agent, or Firm* — Oliff PLC

(57) ABSTRACT

An electronic device comprises chip components aligned along a predetermined first direction and including respective terminal electrodes, and a metal block including an electrode-opposing surface and a mounting surface. The electrode-opposing surface is opposed and connected to the respective terminal electrodes of the chip components continuously along the first direction. The mounting surface is substantially perpendicular to the electrode-opposing surface and is substantially parallel to the first direction to oppose a land pattern when the electronic device is mounted on the land pattern.

14 Claims, 15 Drawing Sheets

ELECTRONIC DEVICE

TECHNICAL FIELD

The present invention relates to an electronic device including chip components.

BACKGROUND

An electronic device in which chip components (e.g., chip capacitors) are integrated with a substrate or the like has been suggested (see, for example, Patent Document 1). Because such an electronic device enables the chip components to be collectively mounted on the substrate or the like, the electronic device exhibits advantageous effects compared to individually mounted chip components in terms of simplification or acceleration of a mounting step. Also suggested is a technique for facilitating assembly or improving heat-dissipation characteristics from chip components by using an insulating case including a protrusion protruding from a plate portion and a side of the plate portion (see, for example, Patent Document 2).

Unfortunately, in the conventional electronic device in which the chip components are integrated, particularly an increase of current may generate excessive heat to cause a more than expected temperature rise of the electronic device.

Patent Document 1: JP Patent Application Laid Open No. H11-8158

Patent Document 2: JP Patent Application Laid Open No. 2022-79393

SUMMARY

The present disclosure provides an electronic device that includes integrated chip components and is capable of preventing a temperature rise due to heat generation despite an increase of current.

Through numerous analyses, the present inventors have found that the amount of heat generation at a joint between a land pattern of a circuit board and a conventional electronic device in which chip components are integrated is relatively larger than the amount of heat generation of the electronic device itself and that taking measures against this phenomenon can prevent or reduce a temperature rise of the device. Based on this new finding, the present inventors have completed the invention of a new electronic device.

An electronic device according to a first aspect of the present invention comprises chip components aligned along a predetermined first direction and including respective terminal electrodes; and a metal block including an electrode-opposing surface and a mounting surface, the electrode-opposing surface being opposed and connected to the respective terminal electrodes of the chip components continuously along the first direction, and the mounting surface being substantially perpendicular to the electrode-opposing surface and being substantially parallel to the first direction to oppose a land pattern when the electronic device is mounted on the land pattern.

The electronic device according to the present invention includes the metal block connected to the respective terminal electrodes of the chip components, and the mounting surface of the metal block opposes the land pattern when the electronic device is mounted thereon. Because the metal block capable of providing a current path having a large sectional area is disposed at a joint between the land pattern and this electronic device, the amount of heat generation can be reduced despite an increase of current to prevent a temperature rise of the electronic device.

For example, a shortest distance $L1$ between the electrode-opposing surface and a centroid of the metal block may be 0.1 times or more and 1.0 times or less a length $L2$ of the chip components in a direction orthogonal to respective end surfaces thereof provided with the respective terminal electrodes.

While the metal block may have any thickness or the like, as the metal block has the predetermined length as the shortest distance $L1$ between the electrode-opposing surface and the centroid, the current path can have a larger sectional area to prevent the temperature rise of the electronic device.

For example, a sectional area of a cross section of the metal block substantially perpendicular to both of the electrode-opposing surface and the mounting surface may be not smaller than an area of a triangle having, as two sides of the triangle, a line of intersection between the cross section and the electrode-opposing surface and a line of intersection between the cross section and the mounting surface.

As the sectional area of the cross section of the metal block is not limited but is the same as or larger than the area of the triangle having, as the two sides of the triangle, the line of intersection between the cross section and the electrode-opposing surface and the line of intersection between the cross section and the mounting surface, a large sectional area can be ensured for the current path to more effectively prevent the temperature rise of the electronic device.

For example, the respective terminal electrodes of the chip components may comprise a first terminal electrode provided on one end surface of each of the chip components and a second terminal electrode provided on an other end surface thereof;

the metal block may comprise a first metal block connected to the first terminal electrode of each of the chip components and a second metal block connected to the second terminal electrode thereof;

the first metal block may comprise a first electrode-opposing surface and a first mounting surface, the first electrode-opposing surface opposing the first terminal electrode, and the first mounting surface being substantially perpendicular to the first electrode-opposing surface and opposing the land pattern when the electronic device is mounted thereon; and the second metal block may comprise a second electrode-opposing surface and a second mounting surface, the second electrode-opposing surface opposing the second terminal electrode, and the second mounting surface being substantially perpendicular to the second electrode-opposing surface and opposing the land pattern when the electronic device is mounted thereon.

For including the first metal block and the second metal block, the metal block can provide current paths having large sectional areas for both the first terminal electrode and the second terminal electrode at joints between the land pattern and the electronic device to effectively prevent the temperature rise of the electronic device.

For example, the chip components may comprise first chip components and second chip components aligned substantially in parallel along the first direction and including the respective terminal electrodes;

the electrode-opposing surface of the metal block may comprise one electrode-opposing surface and an other electrode-opposing surface;

the one electrode-opposing surface may oppose the respective terminal electrodes of the first chip components; and the other electrode-opposing surface may be opposite the one electrode-opposing surface and oppose the respective terminal electrodes of the second chip components.

In such an electronic device, as the metal block is interposed between the first chip components and the second chip components connected in series via the land pattern, large sectional areas can be ensured for current paths provided at a joint between the land pattern and the first chip components and a joint between the land pattern and the second chip components to effectively prevent heat generation.

For example, the metal block may have a substantially rectangular parallelepiped shape extending in the first direction.

Although the metal block may have any shapes, such as columnar shapes (e.g., a triangular prism shape, a trapezoidal prism shape, and a truncated quadrilateral pyramid shape) other than the rectangular parallelepiped shape, the rectangular parallelepiped shape enables the electronic device to have a stable mounting posture and the current path or paths to have a large sectional area. Also, the metal block having the rectangular parallelepiped shape is simple in shape and is easy to manufacture.

For example, the metal block may comprise an uneven portion at a surface of the metal block facing a direction different from the mounting surface and the electrode-opposing surface.

As the metal block includes the uneven portion, heat-dissipation efficiency from the metal block increases, which can more effectively prevent the temperature rise of such an electronic device.

For example, the electrode-opposing surface of the metal block may join the respective terminal electrodes of the chip components using a conductive joining member.

As the terminal electrodes and the electrode-opposing surface are joined using the conductive joining member, electrical conductivity between the chip components and the metal block can be securely ensured in such an electronic device.

For example, each of the terminal electrodes may be provided on at least one end surface of each of the chip components having a substantially rectangular parallelepiped shape; and the first direction may intersect a direction of a normal line of the at least one end surface.

The chip components can be easily aligned along the first direction using the metal block having a simple shape in such an electronic device to constitute the electronic device including the chip components.

For example, the electronic device may comprise an insulating case, wherein the insulating case includes
  a plate portion continuing in the first direction and opposing respective chip upper surfaces of the chip components opposite the mounting surface;
  a first protrusion provided along a plate-portion first side of the plate portion substantially parallel to the first direction, the first protrusion protruding from the plate portion in a downward direction perpendicular to the first direction; and
  a second protrusion provided along a second direction perpendicular to the first direction and the downward direction, the second protrusion protruding from the plate portion in the downward direction.

Because the chip components, the metal block, and the like can be easily positioned using the insulating case for integration in such an electronic device, productivity is high.

For example, the metal block may have a recess continuing substantially in parallel to the first direction at a surface of the metal block opposite the mounting surface; and the first protrusion may be disposed in the recess.

As the insulating case and the metal block can be securely anchored with positional accuracy in such an electronic device, the electronic device has high dimensional accuracy and high anchoring strength.

An electronic device according to a second aspect of the present invention comprises chip components aligned along a predetermined first direction and including respective terminal electrodes; and
  a metal block including an electrode-opposing surface and a mounting surface, the electrode-opposing surface being opposed and connected to the respective terminal electrodes of the chip components continuously along the first direction, and the mounting surface being substantially perpendicular to the electrode-opposing surface and being substantially orthogonal to the first direction to oppose a land pattern when the electronic device is mounted on the land pattern.

Similarly to the electronic device according to the first aspect, the electronic device according to the second aspect includes the metal block connected to the respective terminal electrodes of the chip components, and the mounting surface of the metal block opposes the land pattern when the electronic device is mounted thereon. Because the metal block capable of providing a current path having a large sectional area is disposed at a joint between the land pattern and such an electronic device, the amount of heat generation can be reduced despite an increase of current to prevent a temperature rise of the electronic device. Note that, because the mounting surface and the first direction are substantially orthogonal, the electronic device has a higher height, which is advantageous in terms of heat-dissipation ability compared to an electronic device having a lower height.

For example, the metal block may comprise a chip-opposing surface; and the chip-opposing surface may be substantially perpendicular to the mounting surface and the electrode-opposing surface and oppose respective chip side surfaces of the chip components substantially perpendicular to respective end surfaces thereof provided with the respective terminal electrodes.

Because the area of contact between the chip components and the metal block is large in such an electronic device, better heat-dissipation characteristics are exhibited.

BRIEF DESCRIPTION OF THE DRAWING(S)

DETAILED DESCRIPTION

The present invention is described below with reference to embodiments illustrated in the figures.

First Embodiment

Figure 1:
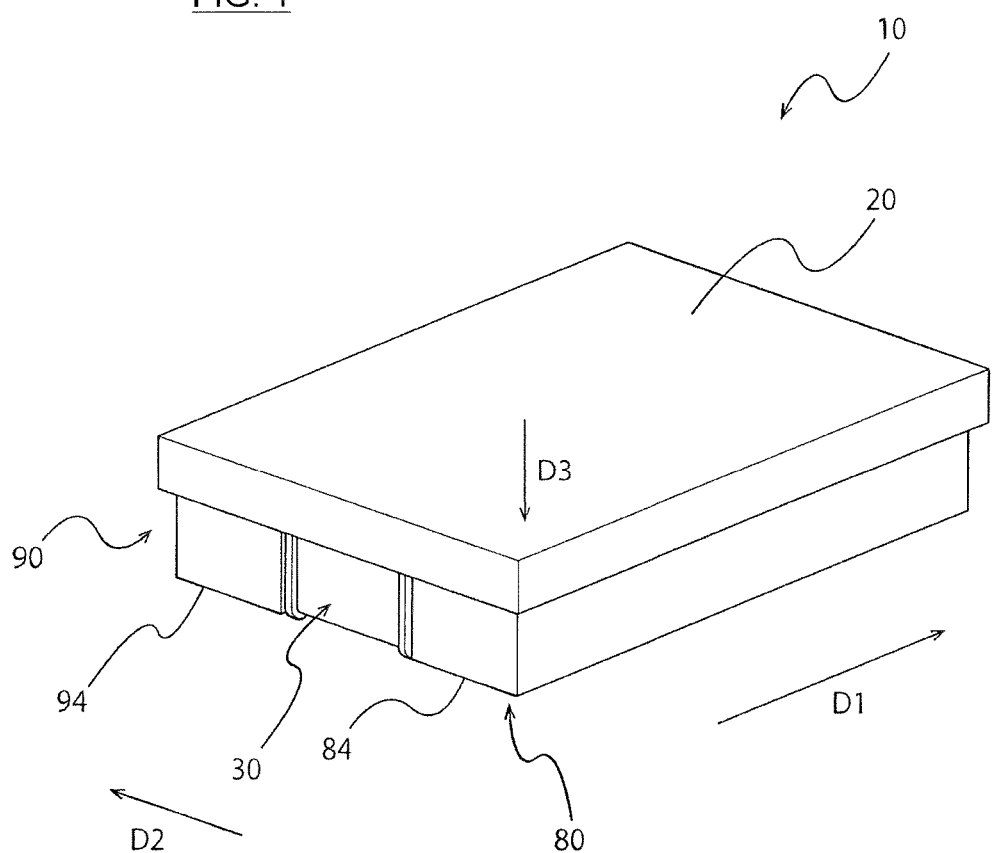
FIG. 1 is a schematic perspective view of an electronic device according to a first embodiment of the present invention viewed from diagonally above.

FIG. 1 is a schematic perspective view of an electronic device 10 according to a first embodiment of the present invention viewed from diagonally above. The electronic device 10 includes chip components 30, a first metal block 80, and a second metal block 90. The electronic device 10 also includes an insulating case 20 to which the chip components 30, the metal blocks 80 and 90, and the like are anchored.

The description of the electronic device 10 is provided on the premise that, as illustrated in FIG. 1, the direction in which the chip components 30 are aligned is a first direction D1; the downward direction from the insulating case 20 disposed at the top of the electronic device 10 to mounting surfaces (a first mounting surface 84 and a second mounting surface 94) thereof is a third direction D3; and the direction perpendicular to the first direction D1 and the third direction D3 is a second direction D2. Note that the first direction D1 and the second direction D2 are substantially parallel to the mounting surfaces of the electronic device 10 and may be referred to as a horizontal direction in the description of the electronic device 10.

Figure 2:
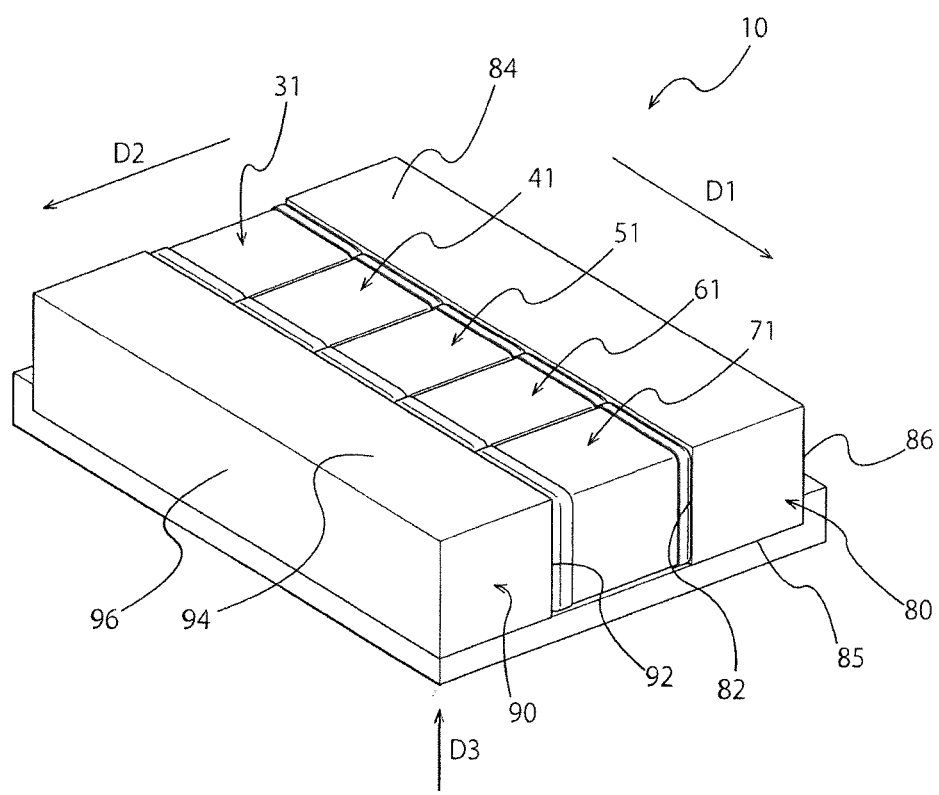
FIG. 2 is a schematic perspective view of the electronic device illustrated in FIG. 1 viewed from diagonally below.

FIG. 2 is a perspective view of the electronic device 10 viewed from diagonally below. As illustrated in FIG. 2, the chip components 30 of the electronic device 10 include five chip components, namely chip components 31, 41, 51, 61, and 71. The chip components 30 including the five chip components 31, 41, 51, 61, and 71 are aligned along the predetermined first direction D1. The first direction D1 is substantially parallel to the mounting surfaces 84 and 94 of the metal blocks 80 and 90 (described later) of the electronic device 10 but is not limited thereto. The first direction D1 may be perpendicular to the mounting surfaces of the metal blocks (see, for example, FIG. 10).

The number of the chip components 31, 41, 51, 61, and 71 included in the chip components 30 is not limited to five as illustrated in FIG. 2. The electronic device 10 may include any number that is two or more of the chip components 31, 41, 51, 61, and 71. Because the chip components 31, 41, 51, 61, and 71 have substantially the same shape, size, and structure, mainly the description of the chip component 31 is provided, and the description of the chip components 41, 51, 61, and 71 is omitted. However, the chip components 31, 41, 51, 61, and 71 included in the chip components 30 are not limited to identical ones illustrated in FIG. 2, and those having different shapes or sizes may be included in the chip components 30.

Figure 3:
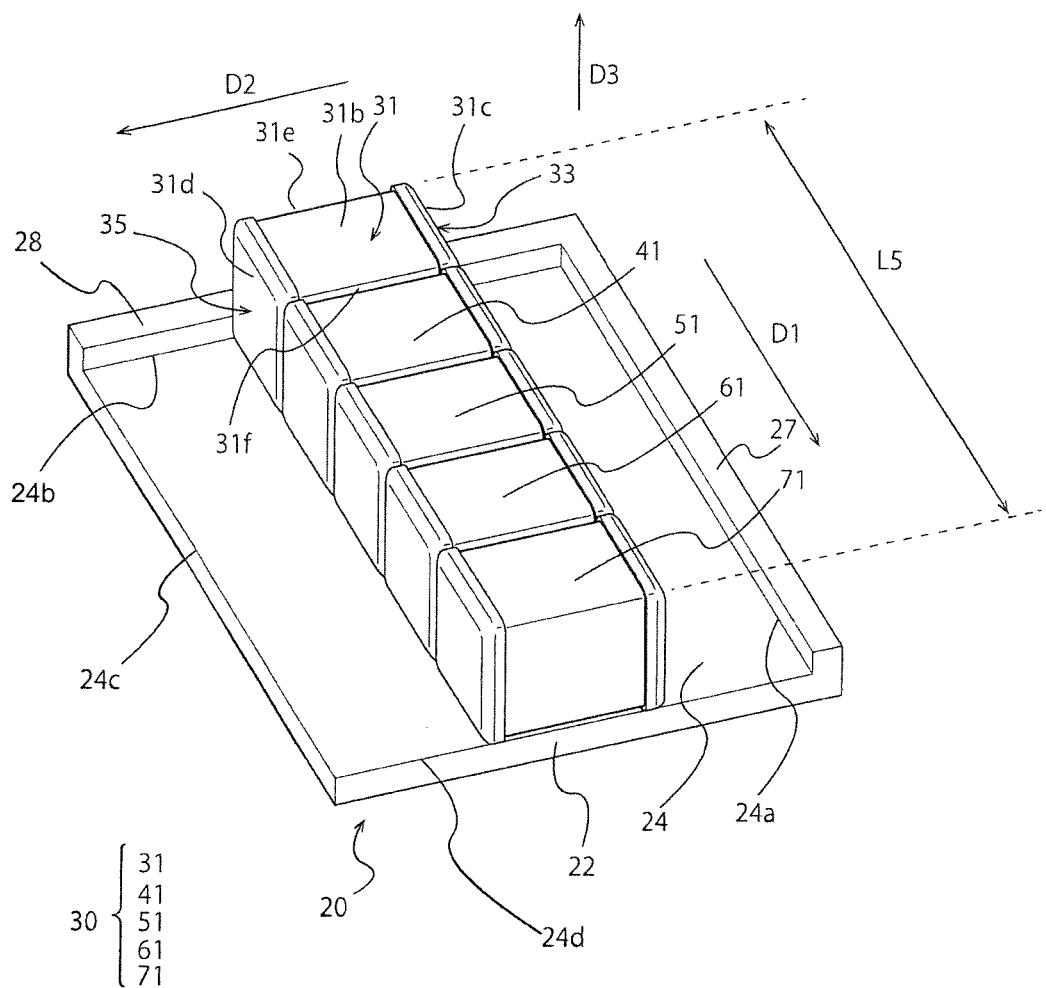
FIG. 3 is a sub-assembly view of members of the electronic device illustrated in FIG. 2 other than metal blocks.

FIG. 3 is a schematic view of the members of the electronic device 10 illustrated in FIG. 2 other than the metal blocks 80 and 90. As illustrated in FIG. 2, the chip component 31 has a substantially rectangular parallelepiped external shape and is disposed so that a chip upper surface 31$a$ of the chip component 31 facing upwards (towards the negative direction of the Z-axis; opposite the third direction D3) faces a plate-portion lower surface 24 of the insulating case 20. Although the chip component 31 included in the electronic device 10 is a chip capacitor, the chip components 31, 41, 51, 61, and 71 are not limited to chip capacitors and may be other chip components, such as chip inductors or chip varistors.

As illustrated in FIG. 3, the chip component 31 includes a pair of terminal electrodes, namely a first terminal electrode 33 and a second terminal electrode 35. The terminal electrodes 33 and 35 of the chip component 31 are provided on at least one of end surfaces 31$c$ and 31$d$ of the chip component 31 having the substantially rectangular parallelepiped shape. The first direction D1 intersects the direction (second direction D2) of normal lines of the end surfaces 31$c$ and 31$d$. That is, the first terminal electrode 33 of the chip component 31 is provided on the first end surface 31$c$, which is one end surface perpendicular to the second direction D2 among surfaces of the chip component 31; and the second terminal electrode 35 of the chip component 31 is provided on the second end surface 31$d$, which is the other end surface perpendicular to the second direction D2 and opposite the first end surface 31$c$.

The terminal electrodes 33 and 35 are provided on the first end surface 31$c$ and the second end surface 31$d$ in their entirety among the surfaces of the chip component 31. The terminal electrodes 33 and 35 extend towards other surfaces adjacent to the first end surface 31$c$ and the second end surface 31$d$ and are partly provided on part of the chip upper surface 31$a$, a chip lower surface 31$b$, and chip side surfaces 31$e$ and 31$f$ of the chip component 31.

Figure 4:
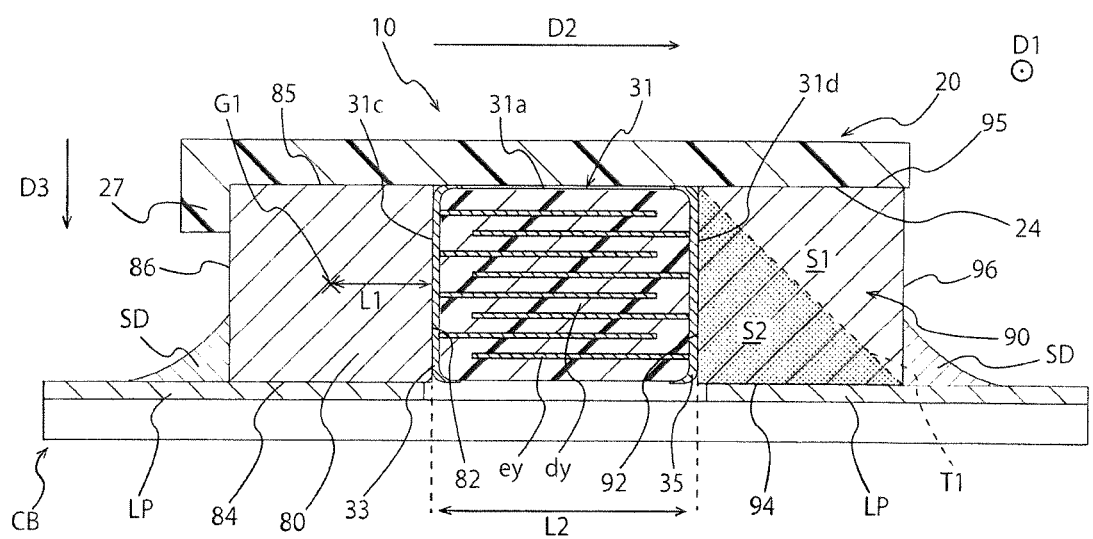
FIG. 4 is a sectional view of the electronic device illustrated in FIGS. 1 and 2 mounted on a circuit board.

FIG. 4 is a schematic sectional view of the electronic device 10 illustrated in FIGS. 1 and 2 mounted on a circuit board CB and illustrates a cross section perpendicular to the mounting surfaces 84 and 94 and the first direction D1. As illustrated in FIG. 4, dielectric layers dy and inner electrode layers ey are alternately laminated inside the chip component 31. The dielectric layers dy may be made from any materials, such as dielectric materials including, for example, calcium titanate, strontium titanate, barium titanate, and their mixture. Each dielectric layer dy may have any thickness but typically has a thickness of 1 μm to several hundred μm. In the present embodiment, each dielectric layer has a thickness of preferably 1.0 to 5.0 μm.

The inner electrode layers ey include a conductive material. Although the conductive material included in the inner electrode layers ey is not limited, a relatively inexpensive base metal can be used when the constituent material of the dielectric layers has resistance to reduction. As the base metal for the inner electrode layers ey, Ni or a Ni alloy is preferable. The Ni alloy is preferably an alloy of Ni and at least one element selected from Mn, Cr, Co, and Al, and the Ni content of this alloy is preferably 95 wt % or more. Note that Ni or the Ni alloy may contain approximately 0.1 wt % or less of various trace components, such as P. Also, a commercially available electrode paste may be used to form the inner electrode layers ey. The thickness of the inner electrode layers ey is determined as appropriate based on usage or the like. The inner electrode layers ey may be constituted by a conductive material other than metal.

The inner electrode layers ey laminated inside the chip component 31 include those connected to the first terminal electrode 33 provided on the first end surface 31c and those connected to the second terminal electrode 35 provided on the second end surface 31d. Electric potential difference between the first terminal electrode 33 and the second terminal electrode 35 is applied to the dielectric layers dy of the chip component 31 via the inner electrode layers ey.

The terminal electrodes 33 and 35 may be made from any material and are normally made from, for example, copper, a copper alloy, nickel, or a nickel alloy. However, the terminal electrodes 33 and 35 can also be made from, for example, silver or an alloy of silver and palladium. The thickness of the terminal electrodes 33 and 35 is not limited and is normally approximately 10 to 50 μm. A metal coating made from at least one selected from Ni, Cu, Sn, and the like may be formed on surfaces of the terminal electrodes 33 and 35.

As illustrated in FIGS. 1 and 2, the electronic device 10 includes the metal blocks 80 and 90 consisting of the first metal block 80 and the second metal block 90. The metal blocks 80 and 90 are connected to the terminal electrode 33 or 35 of each of the chip components 31, 41, 51, 61, and 71 continuously along the first direction D1. As illustrated in FIGS. 1 and 2, the metal blocks 80 and 90 include electrode-opposing surfaces (a first electrode-opposing surface 82 and a second electrode-opposing surface 92), which oppose the terminal electrode 33 or 35, and the mounting surfaces (the first mounting surface 84 and the second mounting surface 94), which are substantially perpendicular to the electrode-opposing surfaces and oppose a land pattern LP (see FIG. 4) of the circuit board CB when the electronic device is mounted thereon. As illustrated in FIG. 2, the mounting surfaces 84 and 94 of the metal blocks 80 and 90 are substantially parallel to the first direction D1.

The first metal block 80 included in the metal blocks 80 and 90 is connected to the first terminal electrode 33 provided on the first end surface 31c of each of the chip components 31, 41, 51, 61, and 71, whereas the second metal block 90 included in the metal blocks 80 and 90 is connected to the second terminal electrode 35 provided on the second end surface 31d of each of the chip components 31, 41, 51, 61, and 71.

Specifically, as illustrated in FIG. 4, the first metal block 80 includes the first electrode-opposing surface 82, which opposes the first terminal electrode 33, and the first mounting surface 84, which is substantially perpendicular to the first electrode-opposing surface 82 and opposes the land pattern when the electronic device is mounted thereon. Likewise, the second metal block 90 includes the second electrode-opposing surface 92, which opposes the second terminal electrode 35, and the second mounting surface 94, which is substantially perpendicular to the second electrode-opposing surface 92 and opposes the land pattern LP when the electronic device is mounted thereon.

As illustrated in FIG. 2, the metal blocks 80 and 90 have a substantially rectangular parallelepiped shape extending in the first direction D1 as their longitudinal direction. However, the shapes of the metal blocks 80 and 90 are not limited to the rectangular parallelepiped and may be other shapes, such as a quadrangular prism (e.g., a trapezoidal prism), a triangular prism, and a truncated quadrilateral pyramid.

As illustrated in FIGS. 2 and 3, the metal blocks 80 and 90 are disposed so that the chip components 30 aligned in the first direction D1 are interposed between the metal blocks 80 and 90 from the end surfaces 31c and 31d sides. For example, the length of the metal blocks 80 and 90 in the first direction D1 can be substantially the same as the total length (L5 (see FIG. 3)) of the chip components 30 in the first direction D1 to which the metal blocks 80 and 90 connect but is not limited thereto.

As illustrated in FIG. 2, the first electrode-opposing surface 82 of the first metal block 80 is preferably joined to the respective first terminal electrodes 33 of the chip components 31, 41, 51, 61, and 71 using a conductive joining member. Examples of conductive joining members include solder and conductive adhesives. However, as the conductive joining member, one that melts at a temperature higher than the temperature at which solder SD illustrated in FIG. 4 melts is preferable in order to avoid changes in the joining state when the electronic device is mounted on the circuit board.

Preferably, the first electrode-opposing surface 82 of the first metal block 80 is in direct contact with the respective first terminal electrodes 33 of all chip components 31, 41, 51, 61, and 71 or is electrically connected thereto via only the conductive joining member. However, electrical connection between the first metal block 80 and some of the chip components 31, 41, 51, 61, and 71 may be ensured indirectly via, for example, the first terminal electrodes of the remaining chip components.

The second electrode-opposing surface 92 of the second metal block 90 is preferably joined to the respective second terminal electrodes 35 of the chip components 31, 41, 51, 61, and 71 using a conductive joining member. Examples of the conductive joining member for joining the second electrode-opposing surface 92 and the second terminal electrodes 35 include solder and conductive adhesives, similarly to the conductive joining member for joining the first electrode-opposing surface 82 and the first terminal electrodes 33. In the electronic device 10, the second metal block 90 has the same shape as the first metal block 80 and is disposed in substantial symmetry with respect to the first metal block 80.

As illustrated in FIG. 4, with the mounting surfaces 84 and 94 of the metal blocks 80 and 90 facing the circuit board CB (downwards), the electronic device 10 is mounted on the circuit board CB by being placed on the land pattern LP of the circuit board CB. When the electronic device 10 is mounted on the circuit board CB, the mounting surfaces 84 and 94 of the metal blocks 80 and 90 oppose the land pattern LP and electrically join the land pattern LP either by being in direct contact with the land pattern LP or via the solder SD. The solder SD may form a solder fillet between the land pattern LP and block outer surfaces 86 and 96 opposite the electrode-opposing surfaces 82 and 92 of the metal blocks 80 and 90.

As is understandable from FIG. 4 (sectional view), because the metal blocks 80 and 90 of the electronic device 10 are solid blocks or blocks having large sectional areas, current paths having large sectional areas can be provided from the land pattern LP of the circuit board CB to the terminal electrodes 33 and 35 of the chip component 31. For example, a shortest distance L1 between the electrode-opposing surface 82 and a centroid G1 of the first metal block 80 is preferably 0.1 times or more and 2.0 times or less a length L2 of the chip component 31 in the direction orthogonal to the first end surface 31c of the chip component 31 provided with the terminal electrode 33 or is more preferably 0.2 times or more and 1.0 times or less the length L2.

As the ratio of the shortest distance L1 between the first electrode-opposing surface 82 and the centroid G1 to the length L2 of the chip component 31 is not smaller than the predetermined ratio, a large sectional area can be ensured for the corresponding current path to prevent heat generation despite a large current flow. Also, as the ratio of the shortest distance L1 between the first electrode-opposing surface 82 and the centroid G1 to the length L2 of the chip component 31 is not larger than the predetermined ratio, an excessive increase in size or weight of the electronic device 10 can be prevented. The same applies to a shortest distance between the second electrode-opposing surface 92 and a centroid of the second metal block 90, similarly to the shortest distance L1 between the first electrode-opposing surface 82 and the centroid G1 of the first metal block 80.

As illustrated in FIG. 4, in the electronic device 10, a sectional area S1 of a cross section substantially perpendicular to the second electrode-opposing surface 92 and the second mounting surface 94 of the second metal block 90 is preferably not smaller than an area S2 (shown in gray in FIG. 4) of a triangle T1 having, as two sides of the triangle, a line of intersection between the cross section and the second electrode-opposing surface 92 and a line of intersection between the cross section and the second mounting surface 94. As the sectional area S1 of the cross section is large, a large sectional area can be ensured for the corresponding current path from the circuit board CB to the chip component 31 to effectively prevent heat generation despite usage involving a large current flow. The same applies to a sectional area of a cross section of the first metal block 80, similarly to the sectional area S1 of the cross section of the second metal block 90.

The metal blocks 80 and 90 may be made from any metal material. Examples of metal materials include simple metals (e.g., Cu, Al, Ag, Mg, Zn, Ni, and Fe) and their alloys. A simple metal containing Cu or Al or an alloy containing Cu or Al is preferable in terms of high conductivity for effective prevention of heat generation. However, because the metal blocks 80 and 90 provide the current paths having large sectional areas, effects of preventing heat generation can be exhibited even when a metal having lower conductivity than Cu or Al is used.

The metal blocks 80 and 90 can be manufactured by, for example, casting, forging, or machining. Each of the metal blocks 80 and 90 may be an integrally molded block or may be a set of plates or the like joined in a block shape.

As illustrated in FIGS. 1 and 2, the insulating case 20 of the electronic device 10 is attached to the chip components 30 and the metal blocks 80 and 90 so that their surfaces opposite the mounting surfaces 84 and 94 are covered. As illustrated in FIG. 3, the insulating case 20 includes a plate portion 22, and a first protrusion 27 and a second protrusion 28 protruding downwards from the plate portion 22.

As illustrated in FIG. 3, the plate portion 22 of the insulating case 20 has a substantially rectangular flat plate shape. The plate portion 22 continues in the first direction D1. The plate-portion lower surface 24, which is a lower surface of the plate portion 22, opposes the chip upper surface 31a (see FIG. 4), which is opposite the mounting surfaces 84 and 94 of the metal blocks 80 and 90, of each chip component.

The first protrusion 27 of the insulating case 20 is provided along a plate-portion first side 24a of the plate portion 22 substantially parallel to the first direction D1 and protrudes downwards (in the third direction D3) from the plate portion 22. The second protrusion 28 of the insulating case 20 is provided along a plate-portion second side 24b of the plate portion 22 substantially parallel to the second direction D2, which is perpendicular to the first direction D1 and the downward direction (the third direction D3), and protrudes downwards from the plate portion 22.

The first protrusion 27 has a quadrangular prism external shape extending in the first direction D1 (X-axis direction) but may have other shapes. For example, the first protrusion 27 may have a different external shape (e.g., a triangular prism) or may be composed of protrusions provided intermittently along the first direction D1, unlike the first protrusion 27 continuously provided in the first direction D1 as illustrated in FIG. 3.

The second protrusion 28 has a quadrangular prism external shape extending in the second direction D2 but may have other shapes. For example, the second protrusion 28 may have a different external shape (e.g., a triangular prism) or may be composed of an isolated protrusion provided apart from the first protrusion 27 in the second direction D2, unlike the second protrusion 28 continuously provided in the second direction D2 as illustrated in FIG. 3.

As illustrated in FIG. 3, the first protrusion 27 and the second protrusion 28 of the insulating case 20 of the present embodiment connect substantially perpendicularly to form an L-shaped protrusion at a corner where the plate-portion first side 24a and the plate-portion second side 24b of the plate portion 22 meet.

As illustrated in FIG. 3, whereas the first protrusion 27 and the second protrusion 28 are provided at the plate-portion first side 24a of the plate-portion lower surface 24 and the plate-portion second side 24b thereof respectively, no protrusion or projection is provided at the other two sides of the plate-portion lower surface 24.

That is, as illustrated in FIG. 3, a non-protruding peripheral portion is provided at a plate-portion third side 24c, which is parallel to the plate-portion first side 24a, and a plate-portion fourth side 24d, which is parallel to the plate-portion second side 24b, of the plate portion 22.

As illustrated in FIG. 4, the chip upper surface 31a of each of the chip components 30 and block upper surfaces 85 and 95 opposite the mounting surfaces 84 and 94 of the metal blocks 80 and 90 oppose the plate-portion lower surface 24 of the insulating case 20. The chip upper surface 31a of each of the chip components 30 and the block upper surfaces 85 and 95 of the metal blocks 80 and 90 are anchored to the plate portion 22 via an adhesive hardened portion (not illustrated in the figures), which is a hardened adhesive. The adhesive may be any non-conductive adhesive, and examples thereof include epoxy based adhesives.

As illustrated in FIG. 4, the length of the first protrusion 27 protruding downwards from the plate portion 22 is shorter than the height dimensions (lengths along the third direction D3) of the chip components 31, 41, 51, 61, and 71 included in the chip components 30 and the metal blocks 80 and 90 and is preferably one half or less the height dimensions of the chip components 31, 41, 51, 61, and 71 and the metal blocks 80 and 90. The same applies to the length of the second protrusion 28 protruding downwards, similarly to the first protrusion 27.

Thus, the chip components 31, 41, 51, 61, and 71 included in the chip components 30 are surface-mounted on the circuit board CB or the like with the chip lower surfaces of the chip components 31, 41, 51, 61, and 71 facing downwards as illustrated in FIG. 4, with no interruption by the first protrusion 27 or the second protrusion 28.

The insulating case 20 illustrated in FIG. 3 can be manufactured by, for example, resin molding or machine processing of a plate material. The insulating case 20 may be made from any insulating material but is preferably made from resin in terms of stress mitigation.

When the electronic device 10 is assembled, multiple block-shaped parts, such as the chip components 31, 41, 51, 61, and 71 and the metal blocks 80 and 90, need to be arranged with accuracy. As the insulating case 20 including the plate portion 22, the first protrusion 27, and the second protrusion 28 as illustrated in FIG. 3 is used, the chip components 31, 41, 51, 61, and 71 and the metal blocks 80 and 90 can be efficiently arranged in a state illustrated in FIG. 2 with accuracy. Also, as the chip components 31, 41, 51, 61, and 71, the metal blocks 80 and 90, and the like are anchored using the adhesive to the insulating case 20, the joining strength of the members included in the electronic device 10 is increased, and the electronic device 10 can be protected from damage attributed to impact, vibration, thermal deformation, or the like.

As illustrated in FIG. 4, because the metal blocks 80 and 90 capable of providing the current paths having large sectional areas are disposed at the joints between the land pattern LP and the electronic device 10, the amount of heat generation in the current paths can be reduced despite an increase of the current applied to the electronic device 10 to prevent a temperature rise of the electronic device 10.

Second Embodiment

Figure 5:
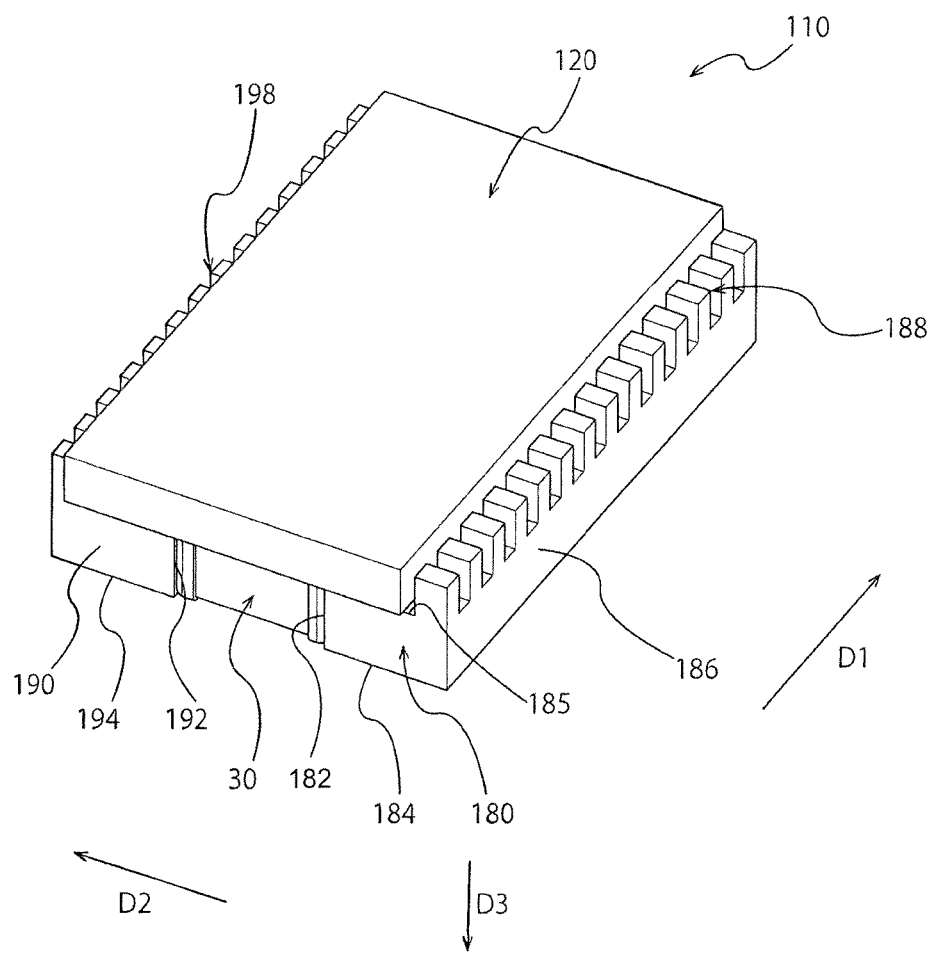
FIG. 5 is a schematic perspective view of an electronic device according to a second embodiment of the present invention viewed from diagonally above.

FIG. 5 is a perspective view of an electronic device 110 according to a second embodiment viewed from diagonally above. The electronic device 110 is the same as the electronic device 10 except that the electronic device 110 includes metal blocks 180 and 190 and the like having different shapes from those of the electronic device 10 illustrated in FIGS. 1 to 4. The description of the electronic device 110 is provided focusing on the difference from the electronic device 10, and the description of similarities between the electronic devices 110 and 10 is omitted while the reference numerals common to the electronic devices 110 and 10 are labeled in the figures.

Figure 6:
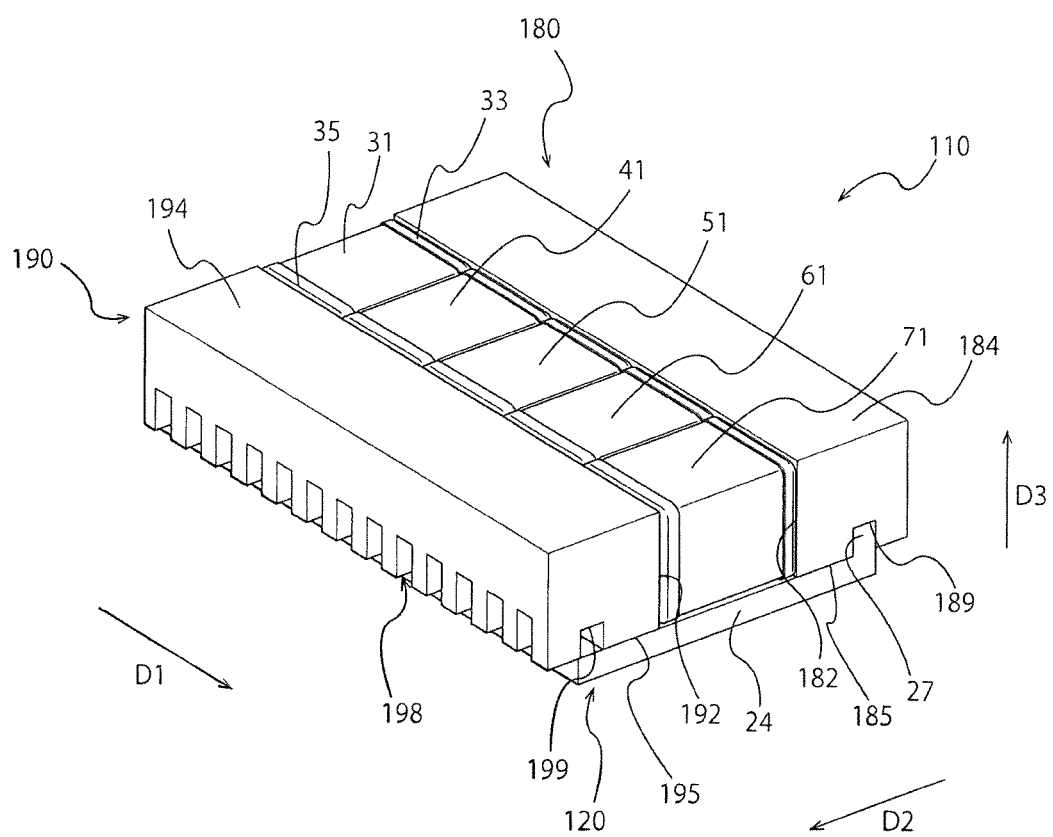
FIG. 6 is a schematic perspective view of the electronic device illustrated in FIG. 5 viewed from diagonally below.

As illustrated in FIG. 5, the electronic device 110 includes chip components 30, an insulating case 120, and the metal blocks 180 and 190, similarly to the electronic device 10. As illustrated in FIG. 6, the electronic device 110 is similar to the electronic device 10 in that the chip components 30 consist of five chip components 31, 41, 51, 61, and 71 aligned along the first direction D1 and that the chip components 30 and the metal blocks 180 and 190 are disposed on and anchored to a plate-portion lower surface 24 of a plate portion 22 of the insulating case 120.

As illustrated in FIG. 6, the metal blocks 180 and 190 of the electronic device 110 consist of the first metal block 180 connected to respective first terminal electrodes 33 of the chip components 31, 41, 51, 61, and 71 and the second metal block 190 connected to respective second terminal electrodes 35 of the chip components 31, 41, 51, 61, and 71. The first metal block 180 includes a first electrode-opposing surface 182, which opposes the first terminal electrodes 33, and a first mounting surface 184, which is substantially perpendicular to the first electrode-opposing surface 182 and opposes the land pattern LP (see FIG. 4) when the electronic device is mounted thereon. The second metal block 190 includes a second electrode-opposing surface 192, which opposes the second terminal electrodes 35, and a second mounting surface 194, which is substantially perpendicular to the second electrode-opposing surface 192 and opposes the land pattern LP (see FIG. 4) when the electronic device is mounted thereon.

Figure 7:
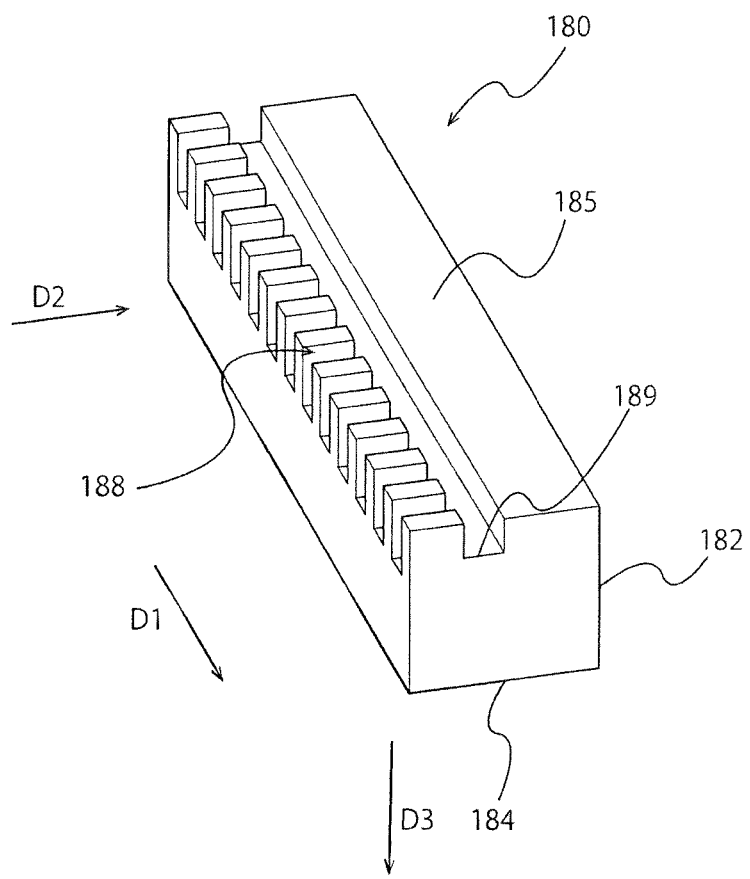
FIG. 7 is a schematic perspective view of a metal block included in the electronic device illustrated in FIG. 5.

As illustrated in FIGS. 5 and 6, the first metal block 180 and the second metal block 190 are partly exposed outside the insulating case 120 in the second direction D2. FIG. 7 is a perspective view of the first metal block 180. As illustrated in FIG. 7, the first metal block 180 has a recess 189, which is provided on a block upper surface 185 opposite the first mounting surface 184 of the first metal block 180 and extends substantially in parallel to the first direction D1. As illustrated in FIG. 6, a first protrusion 27 of the insulating case 120 is disposed in the recess 189 of the first metal block 180. Thus, the first metal block 180 is anchored to the insulating case 120 more certainly and accurately.

As illustrated in FIG. 7, the first metal block 180 includes an uneven portion 188 provided at the block upper surface 185, which is one of the surfaces facing a direction different from the first mounting surface 184 and the first electrode-opposing surface 182. As illustrated in FIG. 5, the uneven portion 188 is provided more apart from the first electrode-opposing surface 182 than the recess 189 and is exposed from the insulating case 120 when viewed from above the electronic device 110.

The first metal block 180 including the uneven portion 188 in this manner is advantageous in terms of heat-dissipation ability due to having a large surface area. The uneven portion 188 is provided at the block upper surface 185 opposite the first mounting surface 184 and apart from the first electrode-opposing surface 182, i.e., at a region having a relatively low current density in the first metal block 180. Thus, the amount of heat generation at the first metal block 180 can be approximately the same as or not much different from that of a metal block having no uneven portion 188.

The second metal block 190 illustrated in FIGS. 5 and 6 is disposed in symmetry with respect to the first metal block 180, with the chip components 30 interposed therebetween, and has the same shape as the first metal block 180. That is, similarly to the first metal block 180, the second metal block 190 has a recess 199, which is provided at a block upper surface 195 of the second metal block 190 and extends substantially in parallel to the first direction D1, and an uneven portion 198, which is provided at the block upper surface 195, and exhibits good heat-dissipation characteristics. Note that the recess 199 of the second metal block 190 does not engage with a protrusion of the insulating case 120.

Similarities between the electronic device 110 according to the second embodiment and the electronic device 10 according to the first embodiment exhibit the same effects brought by the electronic device 10.

Third Embodiment

Figure 8:
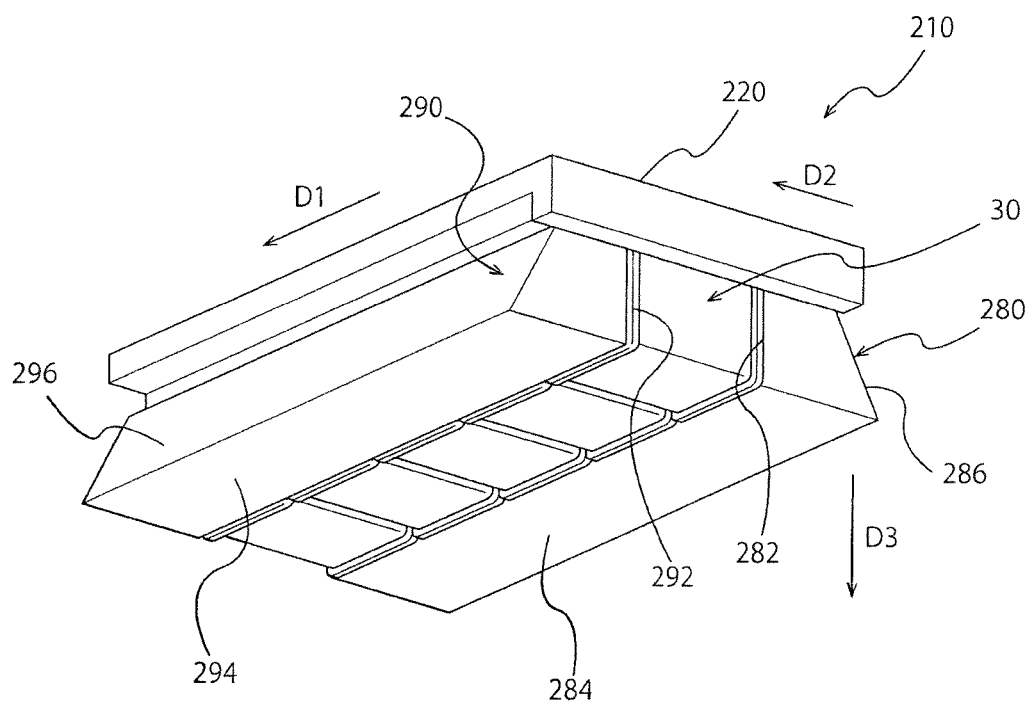
FIG. 8 is a perspective view of an electronic device according to a third embodiment viewed from diagonally below.

FIG. 8 is a perspective view of an electronic device 210 according to a third embodiment viewed from diagonally below. The electronic device 210 is the same as the electronic device 10 except that the electronic device 210 includes metal blocks 280 and 290 and the like having different shapes from those of the electronic device 10 illustrated in FIGS. 1 to 4. The description of the electronic device 210 is provided focusing on the difference from the electronic device 10, and the description of similarities between the electronic devices 210 and 10 is omitted while the reference numerals common to the electronic devices 210 and 10 are labeled in the figures.

As illustrated in FIG. 8, the metal blocks 280 and 290 of the electronic device 210 consist of the first metal block 280 connected to respective first terminal electrodes 33 of chip components 31, 41, 51, 61, and 71 and the second metal block 290 connected to respective second terminal electrodes 35 of the chip components 31, 41, 51, 61, and 71. The first metal block 280 includes a first electrode-opposing surface 282, which opposes the first terminal electrodes 33, and a first mounting surface 284, which is substantially perpendicular to the first electrode-opposing surface 282 and opposes the land pattern LP (see FIG. 4) when the electronic device is mounted thereon. The second metal block 290 includes a second electrode-opposing surface 292, which opposes the second terminal electrodes 35, and a second mounting surface 294, which is substantially perpendicular to the second electrode-opposing surface 292 and opposes the land pattern LP (see FIG. 4) when the electronic device is mounted thereon.

As illustrated in FIG. 8, the metal blocks 280 and 290 have a substantially trapezoidal prism shape having a block outer surface 286 or 296 that is upwardly tilted towards the electrode-opposing surface 282 or 292. Such metal blocks 280 and 290 can have smaller volumes than the metal blocks 80 and 90 having a substantially rectangular parallelepiped shape to have a smaller size and lighter weight. This is because portions of the metal blocks 280 and 290 apart from both of the electrode-opposing surfaces 282 and 292 and the mounting surfaces 284 and 294 are regions having relatively low current densities.

Similarities between the electronic device 210 according to the third embodiment and the electronic device 10 according to the first embodiment exhibit the same effects brought by the electronic device 10.

Fourth Embodiment

Figure 9:
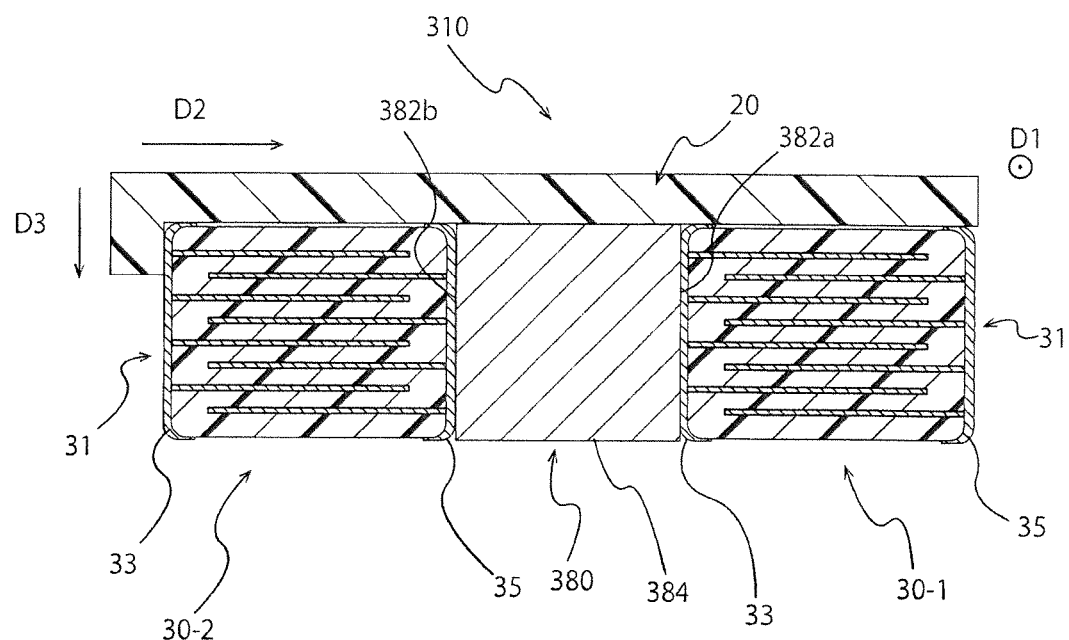
FIG. 9 is a schematic sectional view of an electronic device according to a fourth embodiment.

FIG. 9 is a sectional view of an electronic device 310 according to a fourth embodiment. The electronic device 310 is different from the electronic device 10, in which the chip components 30 in one array are interposed between the two metal blocks 80 and 90, in that one metal block 380 is interposed between two arrays of chip components 30-1 and 30-2. The description of the electronic device 310 is provided focusing on the difference from the electronic device 10, and the description of similarities between the electronic devices 310 and 10 is omitted while the reference numerals common to the electronic devices 310 and 10 are labeled in the figures.

As illustrated in FIG. 9, the chip components of the electronic device 310 include the first chip components 30-1 and the second chip components 30-2, which are aligned substantially in parallel along the first direction D1 and include respective first terminal electrodes 33 and respective second terminal electrodes 35. Although FIG. 9 illustrates only one chip component 31 of the first chip components 30-1 and one chip component 31 of the second chip components 30-2, the first chip components 30-1 and the second chip components 30-2 are the same as the chip components 30 illustrated in FIG. 2 and other figures. That is, the first chip components 30-1 include five chip components 31, 41, 51, 61, and 71 aligned in the first direction D1, and the second chip components 30-2 include another five chip components 31, 41, 51, 61, and 71 aligned in the first direction D1.

The metal block 380 illustrated in FIG. 9 has a substantially rectangular parallelepiped shape, similarly to the metal block 80 illustrated in FIG. 2. The metal block 380 includes a pair of electrode-opposing surfaces 382a and 382b, which oppose the terminal electrodes 33 or the terminal electrodes 35 continuously along the first direction D1; and a mounting surface 384, which is substantially perpendicular to the electrode-opposing surfaces 382a and 382b and is substantially parallel to the first direction D1 to oppose the land pattern LP (see FIG. 4) when the electronic device is mounted thereon. That is, the electrode-opposing surfaces of the metal block 380 include the electrode-opposing surfaces 382a and 382b, which make up the pair of electrode-opposing surfaces 382a and 382b.

As illustrated in FIG. 9, the electrode-opposing surfaces 382a and 382b of the metal block 380 are opposite each other. The electrode-opposing surface 382a opposes the respective terminal electrodes 33 of the first chip components 30-1, and the electrode-opposing surface 382b opposes the respective terminal electrodes 35 of the second chip components 30-2.

The metal block 380 connects to the land pattern LP of the circuit board CB using the solder SD when the electronic device 310 is mounted thereon, similarly to the metal blocks 80 and 90 illustrated in FIG. 4. The metal block 380 constitutes, together with the land pattern LP, a current path electrically connecting the terminal electrodes 33 of the first chip components 30-1 and the terminal electrodes 35 of the second chip components 30-2. Also in the electronic device 310, the metal block 380 can provide a current path having a large sectional area at a joint between the land pattern LP and the electronic device 310 to reduce the amount of heat generation in the current path for preventing a temperature rise of the electronic device 310.

Similarities between the electronic device 310 according to the fourth embodiment and the electronic device 10 according to the first embodiment exhibit the same effects brought by the electronic device 10.

Fifth Embodiment

Figure 10:
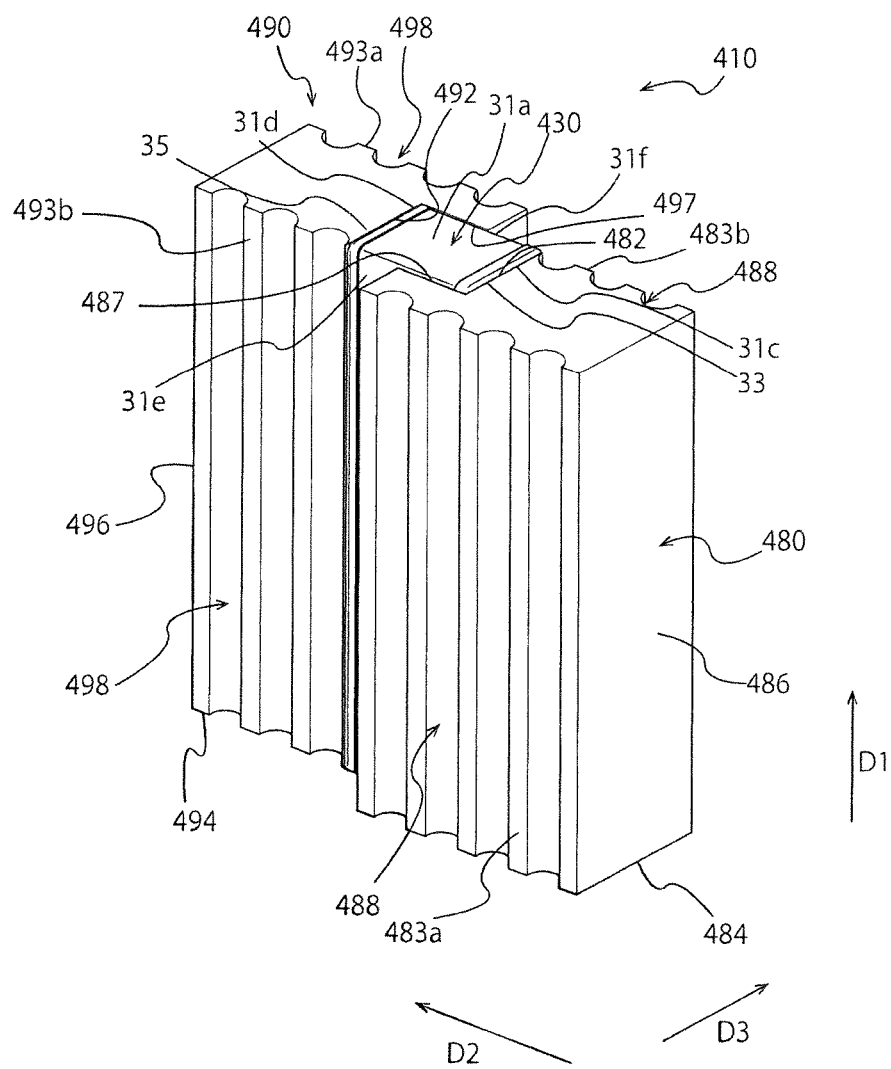
FIG. 10 is a perspective view of an electronic device according to a fifth embodiment viewed from diagonally above.

FIG. 10 is a perspective view of an electronic device 410 according to a fifth embodiment viewed from diagonally above. The electronic device 410 is different from the electronic device 10 according to the first embodiment in that a predetermined first direction D1 in which chip components 430 are aligned and mounting surfaces 484 and 494 of metal blocks 480 and 490 are substantially perpendicular and that the electronic device 410 does not include an insulating case 20. The description of the electronic device 410 is provided focusing on the difference from the electronic device 10, and the description of similarities between the electronic devices 410 and 10 is omitted while the reference numerals common to the electronic devices 410 and 10 are labeled.

As illustrated in FIG. 10, the electronic device 410 includes the chip components 430 and the metal blocks 480 and 490. The chip components 430 consist of five chip components 31, 41, 51, 61, and 71 (see FIG. 3 and other figures), similarly to the chip components 30 illustrated in FIGS. 1 and 2. However, the chip components 31, 41, 51, 61, and 71 of the chip components 430 are aligned along the first direction D1 perpendicular to the mounting surfaces 484 and 494 so as to be stacked one above the other. The chip components 31, 41, 51, 61, and 71 are the same as the chip components 31, 41, 51, 61, and 71 illustrated in FIGS. 1 to 3, and each chip component includes a first terminal electrode 33 and a second terminal electrode 35. The first terminal electrode 33 is provided on a first end surface 31c, which is one end surface of the chip component 31 in the second direction D2 orthogonal to the first direction D1; and the second terminal electrode 35 is provided on a second end surface 31d, which is the other end surface of the chip component 31 in the second direction D2.

The metal blocks 480 and 490 include electrode-opposing surfaces (a first electrode-opposing surface 482 and a second electrode-opposing surface 492), which are opposed and connected to the terminal electrodes 33 or the terminal electrodes 35 of the chip components 31, 41, 51, 61, and 71 continuously along the first direction D1; and the mounting surfaces 484 and 494, which are substantially perpendicular to the electrode-opposing surfaces 482 and 492 and are substantially orthogonal to the first direction D1 to oppose the land pattern LP when the electronic device is mounted thereon.

The metal blocks 480 and 490 include the first metal block 480 connected to the respective first terminal electrodes 33 of the chip components 430 and the second metal block 490 connected to the respective second terminal electrodes 35 of the chip components 430. The first metal block 480 includes the first electrode-opposing surface 482, which opposes the first terminal electrodes 33, and the first mounting surface 484, which is substantially perpendicular to the first electrode-opposing surface 482 and opposes the land pattern LP when the electronic device is mounted thereon. The second metal block 490 includes the second electrode-opposing surface 492, which opposes the second terminal electrodes 35, and the second mounting surface 494, which is substantially perpendicular to the second electrode-opposing surface 492 and opposes the land pattern LP when the electronic device is mounted thereon.

The metal blocks 480 and 490 include uneven portions 488 and 498 provided at block side surfaces 483a, 483b, 493a, and 493b, which are surfaces of the metal blocks facing directions different from the mounting surfaces 484 and 494 and the electrode-opposing surfaces 482 and 492. The block side surfaces 483a, 483b, 493a, and 493b are substantially perpendicular to the mounting surfaces 484 and 494 and the electrode-opposing surfaces 482 and 492. However, unlike the illustration of FIG. 10, the uneven portions 488 and 498 may be provided at block outer surfaces 486 and 496, which are substantially perpendicular to the mounting surfaces 484 and 494 and are opposite the electrode-opposing surfaces 482 and 492. The metal blocks 480 and 490 including the uneven portions 488 and 498 are advantageous in terms of heat-dissipation ability due to having large surface areas.

As illustrated in FIG. 10, the first metal block 480 includes a chip-opposing surface 487, which is substantially perpendicular to the first mounting surface 484 and the first electrode-opposing surface 482 and opposes the chip side surface 31e, which is substantially perpendicular to the first end surface 31c of the chip component 31 provided with the first terminal electrode 33. Similarly to the first metal block 480, the second metal block 490 includes a chip-opposing surface 497, which is substantially perpendicular to the second mounting surface 494 and the second electrode-opposing surface 492 and opposes the chip side surface 31f, which is substantially perpendicular to the second end surface 31d provided with the second terminal electrode 35.

Because the metal blocks 480 and 490 including such chip-opposing surfaces 487 and 497 have a larger area of contact with the chip components 430, better heat-dissipation characteristics are exhibited. The electronic device 410 illustrated in FIG. 10 has a high height from the circuit board CB when mounted thereon and can exhibit more efficient heat-dissipation characteristics to prevent or reduce a temperature rise of the electronic device 410 compared to an electronic device having a low height. Similarly to the electronic device 10, in the electronic device 410, the metal blocks 480 and 490 can provide current paths having large sectional areas at joints between the land pattern LP and the electronic device 410 to effectively reduce the amount of heat generation in the current paths.

Similarities between the electronic device 410 according to the fifth embodiment and the electronic device 10 according to the first embodiment exhibit the same effects brought by the electronic device 10.

Hereinafter, a more detailed description of electronic devices according to the present invention is provided with reference to examples, but the technical scope of the present invention is not limited to these examples.

In the examples, the chip components 30 including the five chip components connected in parallel were combined with five different types of pairs of metal blocks having different dimensions in the second direction D2 to carry out a heat generation simulation for five types of electronic devices having different dimensions of the metal blocks in the second direction D2 (one of the pairs had a dimension of 0 in the second direction D2, meaning that no metal block was used). Each chip component included in the chip components 30 had a dimension of 3.5 mm (in the second direction D2)×2.5 mm (in the first direction D1)×2.5 mm (in the third direction D3). The respective five types of metal blocks had a dimension of 0 mm, 0.8 mm, 1.6 mm, 3.2 mm, and 6.4 mm in the second direction D2. All types of metal blocks had a length of 12.5 mm along the first direction D1 (except for the one with a dimension of 0 mm in the second direction D2).

Figure 11A:
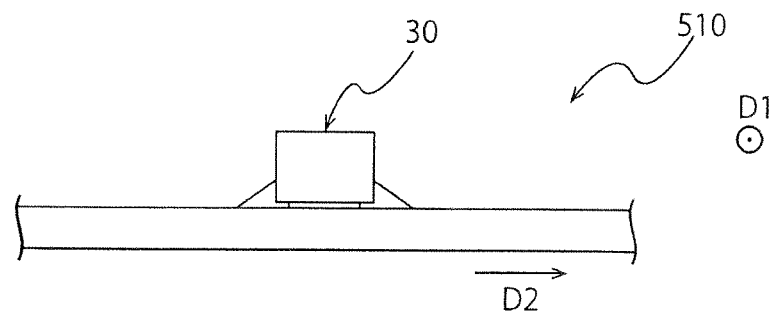
FIGS. 11A to 11C are schematic views illustrative of electronic devices used for heat generation simulation according to examples.
Figure 11B:
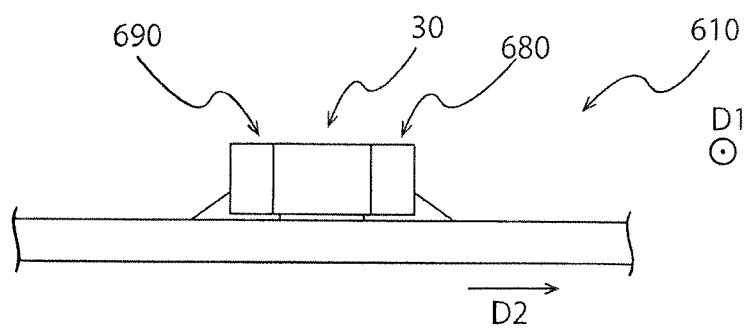
Figure 11C:
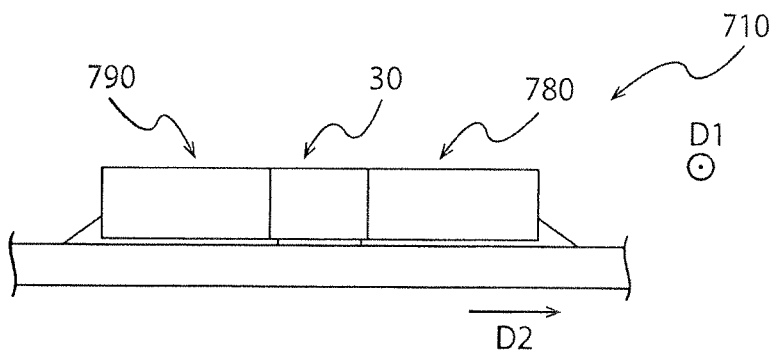

FIGS. 11A to 11C are schematic views comparing electronic devices 510, 610, and 710 used for the heat generation simulation. In the electronic device 510 illustrated in FIG. 11A, metal blocks had a dimension of 0 mm in the second direction D2, meaning that no metal blocks were included. In the electronic device 610 illustrated in FIG. 11B, metal blocks 680 and 690 had a dimension of 1.6 mm in the second direction D2. In the electronic device 710 illustrated in FIG. 11C, metal blocks 780 and 790 had a dimension of 6.4 mm in the second direction D2.

Figure 12:
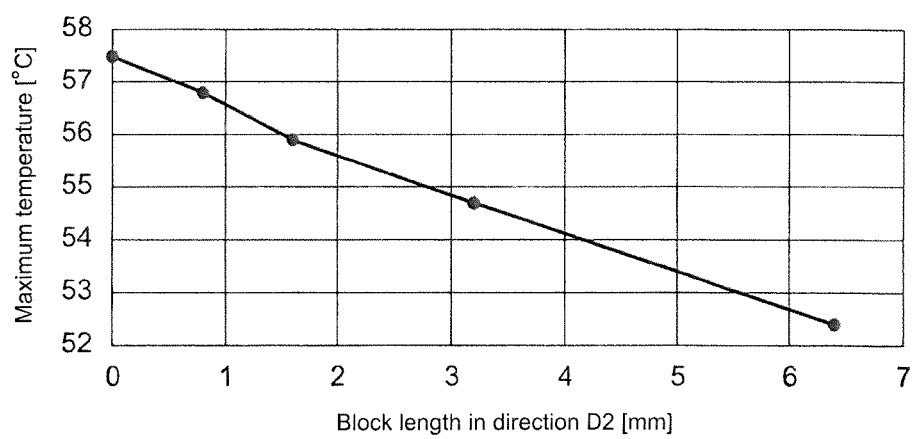
FIG. 12 is a graph showing results of the heat generation simulation according to the examples.

In the heat generation simulation, respective highest temperatures that the electronic devices 510, 610, and 710 illustrated in FIGS. 11A to 11C reached under an environmental temperature of 25° C. when a current of 13.7 A was applied thereto were calculated. FIG. 12 is a graph plotting results of the heat generation simulation of the five types of electronic devices, having a vertical axis representing the highest temperatures of the five types of the electronic devices including the electronic devices 510, 610, and 710 and a horizontal axis representing the dimensions of the metal blocks in the second direction D2.

As is understandable from FIG. 12, from the comparison between the five types of the electronic devices including the electronic devices 510, 610, and 710, it can be understood that the temperature rise of the electronic device 510 including no metal blocks (having a dimension of 0 mm in the second direction D2) was the largest and that temperature rises of the electronic devices were prevented as the dimensions of the metal blocks in the second direction D2 increased.

Figure 13B:
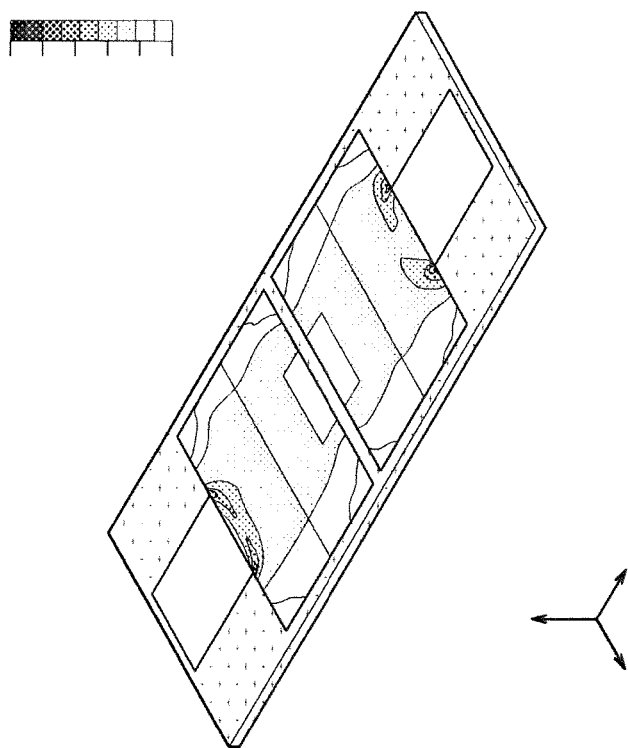
FIGS. 13A and 13B are views showing results of calculating current densities of circuit boards on which the electronic devices used for the heat generation simulation according to the examples are mounted.
Figure 13A:
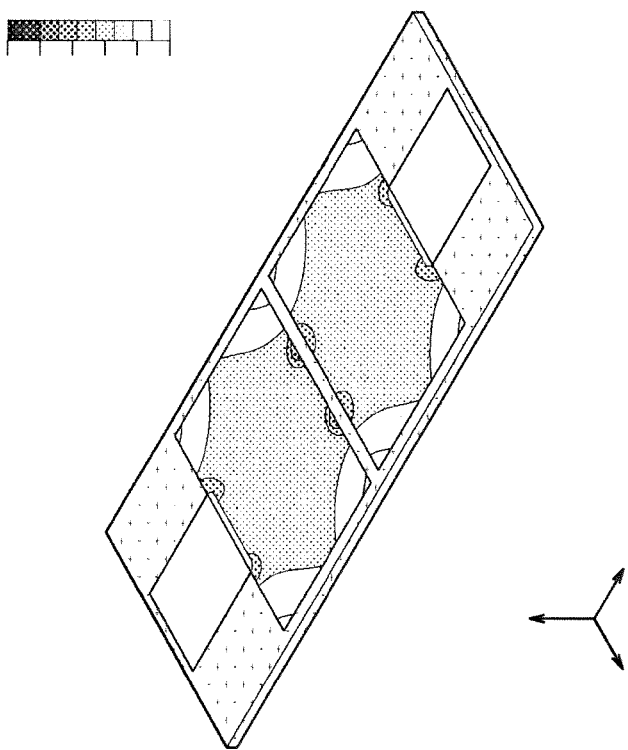

FIGS. 13A and 13B are views showing distributions of current densities at conductor portions (e.g., the land pattern LP) of the circuit boards on which the electronic devices including the metal blocks having a dimension of 0 mm (FIG. 13A) and 3.2 mm (FIG. 13B) in the second direction D2 respectively were mounted. In FIGS. 13A and 13B, dark-colored portions are regions having high current densities, and light-colored portions are regions having low current densities.

As illustrated in FIG. 13A, it is understood that there were regions having high current densities near joints between the electronic device including no metal blocks (having a dimension of 0 in the second direction D2) and the circuit board.

Figure 14:
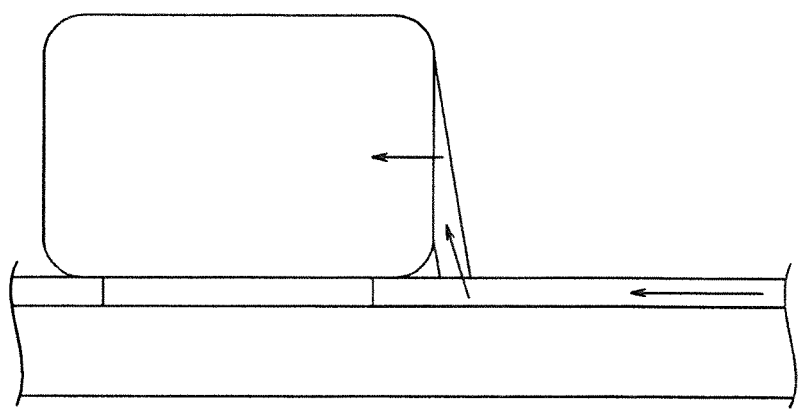
FIG. 14 is a schematic view of a current path of one of the electronic devices used for the heat generation simulation.

FIG. 14 is a schematic view illustrative of a current flow (shown by arrows) of the electronic device including no metal blocks. As illustrated in FIG. 14, the current path at the joints between the electronic device including no metal blocks and the circuit board has a small sectional area. It is assumed that this caused presence of the regions having high current densities illustrated in FIG. 13A near the joints between the electronic device including no metal blocks and the circuit board. Because a self-heating amount of a material is in proportion to a square of a current value, it is assumed that the amount of heat generation of the electronic device including no metal blocks is large at the regions having high current densities illustrated in FIG. 13A to lead to a large temperature rise of the electronic device.

By contrast, as illustrated in FIG. 13B, it is understood that joints between the electronic device including the metal blocks having a dimension of 3.2 mm in the second direction D2, which is approximately the same as the dimension of the chip components in the second direction D2, and the circuit board have low current densities, compared to the electronic device illustrated in FIG. 13A.

Figure 15:
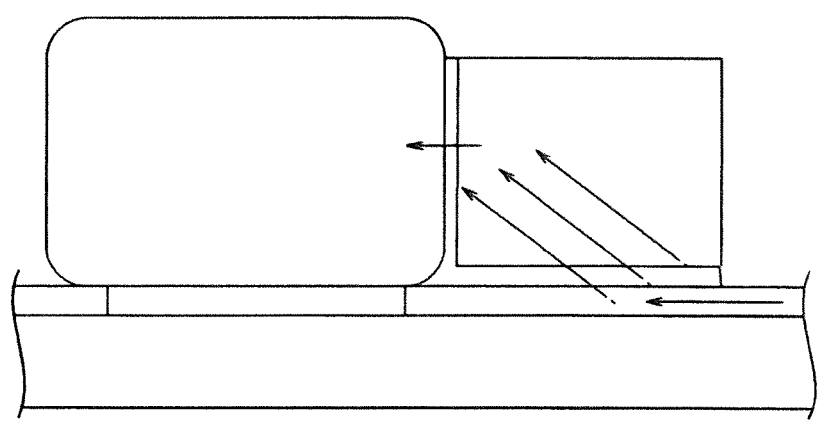
FIG. 15 is a schematic view of a current path of another one of the electronic devices used for the heat generation simulation.

FIG. 15 is a schematic view illustrative of a current flow (shown by arrows) of the electronic device including the metal blocks. As illustrated in FIG. 15, the current path at the joints between the electronic device including the metal blocks and the circuit board has a large sectional area. This kept the current densities low near the joints between the electronic device including the metal blocks and the circuit board as illustrated in FIG. 13B. Thus, it is assumed that the amount of heat generation near the joints between the electronic device including the metal blocks and the circuit board can be reduced to prevent or reduce a temperature rise of the electronic device.

The description of the characteristics of the electronic devices according to the present invention has been provided above using the embodiments and the examples. However, needless to say, the technical scope of the present invention includes many other embodiments, modifies examples, etc. For example, the number of chip components included in the electronic device may be any plural number, or arrangement of the chip components included in the electronic device is not limited to one array or multiple arrays and may be in matrix or in any other planar or three-dimensional arrangement.

REFERENCE NUMERALS 10, 110, 210, 310, 410, 510, 610, 710 . . . electronic device
20, 120 . . . insulating case
22 . . . plate portion
24 . . . plate-portion lower surface
24a . . . plate-portion first side
24b . . . plate-portion second side
27 . . . first protrusion
28 . . . second protrusion
30, 430 . . . chip components
31, 41, 51, 61, 71 . . . chip component
30-1 . . . first chip components
30-2 . . . second chip components
31a . . . chip upper surface
31b . . . chip lower surface
31e, 31f . . . chip side surface
31c . . . first end surface
31d . . . second end surface
33 . . . first terminal electrode
35 . . . second terminal electrode
380, 680, 690, 780, 790 . . . metal block
80, 180, 280, 480 . . . first metal block
90, 190, 290, 490 . . . second metal block
82, 182, 282, 482 . . . first electrode-opposing surface
382a . . . electrode-opposing surface
382b . . . electrode-opposing surface
92, 192, 292, 492 . . . second electrode-opposing surface
384 . . . mounting surface
84, 184, 284, 484 . . . first mounting surface
94, 194, 294, 494 . . . second mounting surface
T1 . . . triangle
G1 . . . centroid
L1 . . . distance L1
85, 95, 185, 195 . . . block upper surface
86, 96, 286, 296, 486, 496 . . . block outer surface
483a, 483b, 493a, 493b . . . block side surface
487, 497 . . . chip-opposing surface
188, 198, 488, 498 . . . uneven portion
189, 199 . . . recess
D1 . . . first direction
D2 . . . second direction
D3 . . . third direction
CB . . . circuit board
LP . . . land pattern
SD . . . solder

What is claimed is:

1. An electronic device comprising:
   chip components aligned along a predetermined first direction and including respective terminal electrodes; and
   a metal block including an electrode-opposing surface and a mounting surface, the electrode-opposing surface being opposed and connected to the respective terminal electrodes of the chip components continuously along the first direction, and the mounting surface being substantially perpendicular to the electrode-opposing surface and being substantially parallel to the first direction to oppose a land pattern when the electronic device is mounted on the land pattern.

2. The electronic device according to claim 1, wherein a shortest distance (L1) between the electrode-opposing surface and a centroid of the metal block is 0.1 times or more and 1.0 times or less a length (L2) of the chip components in a direction orthogonal to respective end surfaces thereof provided with the respective terminal electrodes.

3. The electronic device according to claim 1, wherein a sectional area of a cross section of the metal block substantially perpendicular to both of the electrode-opposing surface and the mounting surface is not smaller than an area of a triangle having, as two sides of the triangle, a line of intersection between the cross section and the electrode-opposing surface and a line of intersection between the cross section and the mounting surface.

4. The electronic device according to claim 1, wherein
   the respective terminal electrodes of the chip components comprise a first terminal electrode provided on one end surface of each of the chip components and a second terminal electrode provided on an other end surface thereof;

the metal block comprises a first metal block connected to the first terminal electrode of each of the chip components and a second metal block connected to the second terminal electrode thereof;

the first metal block comprises a first electrode-opposing surface and a first mounting surface, the first electrode-opposing surface opposing the first terminal electrode, and the first mounting surface being substantially perpendicular to the first electrode-opposing surface and opposing the land pattern when the electronic device is mounted thereon; and the second metal block comprises a second electrode-opposing surface and a second mounting surface, the second electrode-opposing surface opposing the second terminal electrode, and the second mounting surface being substantially perpendicular to the second electrode-opposing surface and opposing the land pattern when the electronic device is mounted thereon.

5. The electronic device according to claim 1, wherein the chip components comprise first chip components and second chip components aligned substantially in parallel along the first direction and including the respective terminal electrodes;

the electrode-opposing surface of the metal block comprises one electrode-opposing surface and an other electrode-opposing surface;

the one electrode-opposing surface opposes the respective terminal electrodes of the first chip components; and the other electrode-opposing surface is opposite the one electrode-opposing surface and opposes the respective terminal electrodes of the second chip components.

6. The electronic device according to claim 1, wherein the metal block has a substantially rectangular parallelepiped shape extending in the first direction.

7. The electronic device according to claim 1, wherein the metal block comprises an uneven portion at a surface of the metal block facing a direction different from the mounting surface and the electrode-opposing surface.

8. The electronic device according to claim 1, wherein the electrode-opposing surface of the metal block joins the respective terminal electrodes of the chip components using a conductive joining member.

9. The electronic device according to claim 1, wherein each of the terminal electrodes is provided on at least one end surface of each of the chip components having a substantially rectangular parallelepiped shape; and the first direction intersects a direction of a normal line of the at least one end surface.

10. The electronic device according to claim 1 comprising an insulating case, wherein the insulating case includes a plate portion continuing in the first direction and opposing respective chip upper surfaces of the chip components opposite the mounting surface;

a first protrusion provided along a plate-portion first side of the plate portion substantially parallel to the first direction, the first protrusion protruding from the plate portion in a downward direction perpendicular to the first direction; and a second protrusion provided along a second direction perpendicular to the first direction and the downward direction, the second protrusion protruding from the plate portion in the downward direction.

11. The electronic device according to claim 10, wherein the metal block has a recess continuing substantially in parallel to the first direction at a surface of the metal block opposite the mounting surface; and the first protrusion is disposed in the recess.

12. An electronic device comprising:

chip components aligned along a predetermined first direction and including respective terminal electrodes; and a metal block including an electrode-opposing surface and a mounting surface, the electrode-opposing surface being opposed and connected to the respective terminal electrodes of the chip components continuously along the first direction, and the mounting surface being substantially perpendicular to the electrode-opposing surface and being substantially orthogonal to the first direction to oppose a land pattern when the electronic device is mounted on the land pattern.

13. The electronic device according to claim 12, wherein the metal block comprises a chip-opposing surface; and the chip-opposing surface is substantially perpendicular to the mounting surface and the electrode-opposing surface and opposes respective chip side surfaces of the chip components substantially perpendicular to respective end surfaces thereof provided with the respective terminal electrodes.

14. The electronic device according to claim 12, wherein the metal block comprises an uneven portion at a surface of the metal block facing a direction different from the mounting surface and the electrode-opposing surface.

* * * * *